(12) United States Patent
Stocken et al.

(10) Patent No.: US 7,023,701 B2
(45) Date of Patent: Apr. 4, 2006

(54) DEVICE FOR COOLING MEMORY MODULES

(75) Inventors: Christian Stocken, München (DE); Stephan Schröder, München (DE); Thomas Huber, München (DE); Manfred Pröll, Dorfen (DE)

(73) Assignee: Infineon Technologies, AG, Munich (DE)

( * ) Notice: Subject to any disclaimer, the term of this patent is extended or adjusted under 35 U.S.C. 154(b) by 1 day.

(21) Appl. No.: 10/829,362

(22) Filed: Apr. 22, 2004

(65) Prior Publication Data

US 2005/0018401 A1  Jan. 27, 2005

(30) Foreign Application Priority Data

May 5, 2003 (DE) ................ 103 19 984

(51) Int. Cl.
*H05K 7/20* (2006.01)
(52) U.S. Cl. ............... 361/704; 361/715; 361/716; 361/695; 174/16.1; 174/16.3; 165/80.3; 165/185
(58) Field of Classification Search ........... 361/690, 361/704, 707, 713–716, 719–721; 165/80.3, 165/185; 174/16.3; 257/712, 718, 719, 257/726, 727
See application file for complete search history.

(56) References Cited

U.S. PATENT DOCUMENTS

| | | | |
|---|---|---|---|
| 4,763,298 A | 8/1988 | Hoelzel et al. | |
| 5,239,199 A * | 8/1993 | Chiu | 257/706 |
| 5,420,751 A * | 5/1995 | Burns | 361/707 |
| 5,640,302 A * | 6/1997 | Kikinis | 361/687 |
| 5,684,675 A * | 11/1997 | Taniguchi et al. | 361/704 |
| 5,843,807 A | 12/1998 | Burns | |
| 5,963,427 A | 10/1999 | Bollesen | |
| 6,025,992 A * | 2/2000 | Dodge et al. | 361/704 |
| 6,319,756 B1 | 11/2001 | Duesman et al. | |
| 6,349,385 B1 * | 2/2002 | Kaminski et al. | 713/300 |
| 6,421,240 B1 * | 7/2002 | Patel | 361/699 |
| 6,496,375 B1 * | 12/2002 | Patel et al. | 361/719 |
| 6,504,722 B1 * | 1/2003 | Vittet et al. | 361/704 |
| 6,775,139 B1 * | 8/2004 | Hsueh | 361/697 |
| 6,853,554 B1 * | 2/2005 | Bash et al. | 361/699 |

FOREIGN PATENT DOCUMENTS

WO  WO 01/22490 A1  3/2001
WO  WO 02/13264 A1  2/2002

* cited by examiner

*Primary Examiner*—Boris Chervinsky
(74) *Attorney, Agent, or Firm*—Edell, Shapiro & Finnan, LLC

(57) ABSTRACT

A device for cooling memory modules can include a plurality of elements. The elements can thermal couple at least two memory modules. The device can further include a body or a plurality of contact areas bearing in a planar manner.

7 Claims, 3 Drawing Sheets

DEVICE FOR COOLING MEMORY MODULES

CROSS REFERENCE TO RELATED APPLICATIONS

This application claims priority under 35 USC §119(e) to German Application No. 10319984.5, filed on May 5, 2003, and titled "Device For Cooling Memory Modules," the entire contents of which are hereby incorporated by reference.

FIELD OF THE INVENTION

The invention relates to a device for cooling memory modules which has elements for thermal coupling at least two memory modules.

BACKGROUND

Memory components, which are used in computers, for example, generate heat. This evolution of heat increases as the power increases. Heat needs to be dissipated the heat in order to avoid overheating of the memory chips. One possibility for counteracting this evolution of heat is to reduce the operation voltage. In order to dissipate the heat that arises it is customary to use fans, for example, in computer housings. The fans transport the heated air in the vicinity of the chips toward the outside. It is also already well known to directly cool individual memory chips, such as on graphics cards, for example.

It is customary nowadays in PC technology to realize the memory chips as, i.e., "DIMM" modules. In this case, individual chips, combined as a module, are mounted on a card and the card is then plugged on the main board, i.e., the "motherboard". In order to address these DIMM modules in a PC, slots for receiving one or more of these memory modules are arranged on the main board. In order to avoid signal delay times, the DIMM modules are usually arranged proximate to the processor.

The cooling techniques customary heretofore have resulted in only inadequate cooling being effected by means of the previous solutions. The increase in the evolution of heat grows, and the evolution of heat is not distributed homogeneously between all the memory modules due to nonuniform access to partial areas of the total available memory space. The occurrence of nonuniform heating of the memory chips within a module is equally possible since current consumption and thus the formation of heat is much greater in the active mode than in the standby mode. Furthermore, the memory modules take up different quantities of heat from a plurality of heat carriers, such as processor and graphics card, depending on the distance from the latter. This results in a greater thermal loading of those memory chips currently being accessed. Conversely, it is desirable, however, to keep the temperature fluctuation of each memory cell as low as possible.

SUMMARY

Dissipating the thermal power of memory chips and avoiding excessive temperature fluctuations is desirable.

Memory modules are in thermal contact with one another via a thermally conductive bridge provides for a uniform thermal loading. An increased surface area is provided by cooling fins in order to dissipate the heat better. Moreover, the cooling can be actively improved by a fan or a Peltier element.

BRIEF DESCRIPTION OF THE FIGURES

The invention is explained in more detail below using an exemplary embodiment with reference to the drawing.

DETAILED DESCRIPTION

Figure 1:
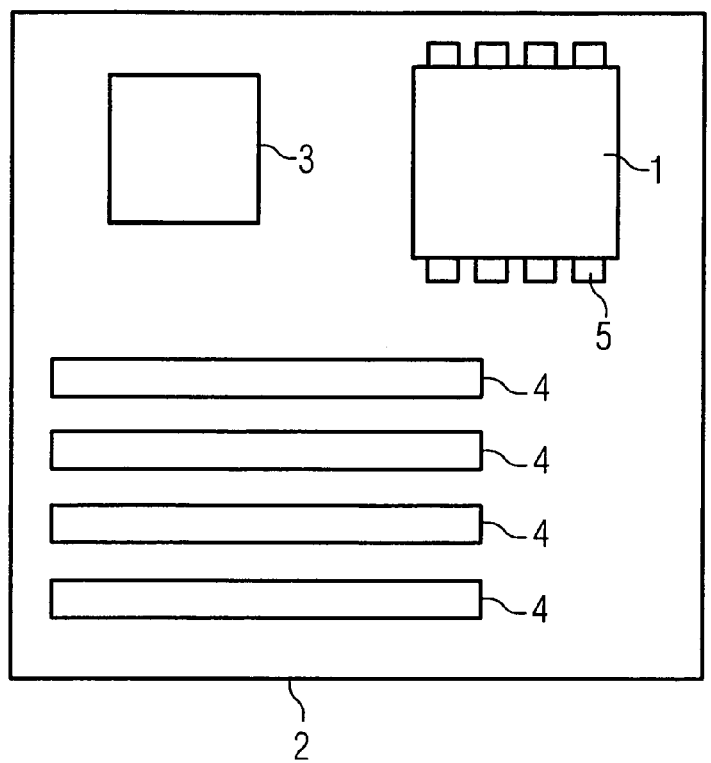
FIG. 1 shows the use of the device according to the invention on a motherboard.

FIG. 1 shows a basic illustration of the main board or the "motherboard" 2 of a PC. The illustration diagrammatically shows the arrangement with a processor 3, slots 4 for peripheral cards and a cooling device 1 for memory modules 5, which for the most part covers the memory modules 5.

Figure 2:
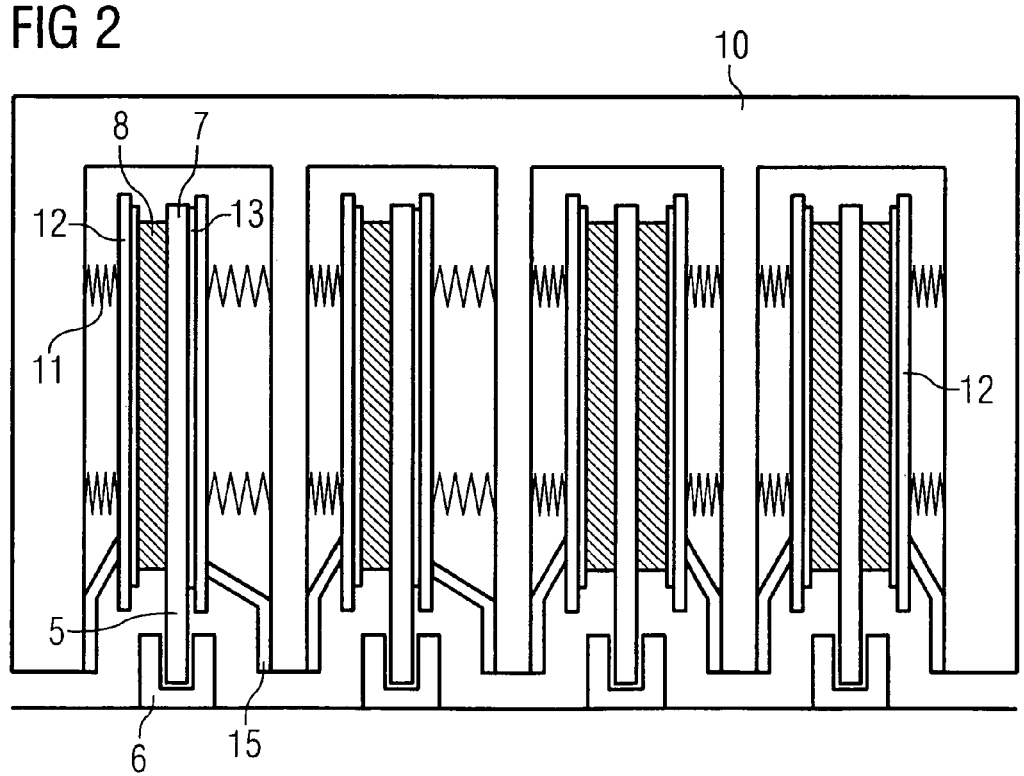
FIG. 2 shows the device in a cross-sectional illustration.

FIG. 2 shows a cross section through the cooling device 1 illustrated in FIG. 1. The memory modules 5 are connected to the motherboard 2 via slots 6. In this case, the memory modules 5 cab include a circuit board 7 for accommodating a plurality of memory chips 8. The cooling device 1 can include a basic body 10 and elements which produce a thermal connection to the memory modules 5. A contact area 12 can be pressed onto the memory chips 5 by spring elements 11. In this case, the contact area 12 can be connected to the basic body 10.

In a specific refinement, the contact area 12 can have an insulating layer 13. The contact area 12 can produce a connection between basic body 10 and the memory chips 8, which connection can ensure a good heat flow. For this purpose, the spring elements 11 press the contact area 12 onto the memory chips 8 such that it rests in a planar manner. The pressing-on can produce a force-locking connection between the basic body 10 and the memory chip 8. By virtue of this measure, the cooling device 1 can be fixed sufficiently firmly to the memory chip, even if the computer is transported or installed in a tilted manner.

FIG. 2 illustrates an application with four memory modules 5. In this case, two of the memory modules 5 can be populated with memory chips 8 on both sides, and two are populated with memory chips 8 on one side. However, the contact areas can be disposed to produce a force-locking thermally conductive connection, even if the total thickness of memory chip 8 and circuit board 7 varies. Therefore, flexible connections 15 can be provided for the contact areas 12. An insulation layer 13 on the contact area 12 can prevent the short-circuiting of non-insulated lines on the memory module.

The memory chips of the DIMM modules surrounded by the basic body 10 can have an approximately equally good thermal connection to the basic body 10 and a uniform heating of all the memory chips is thus ensured.

Figure 3A:
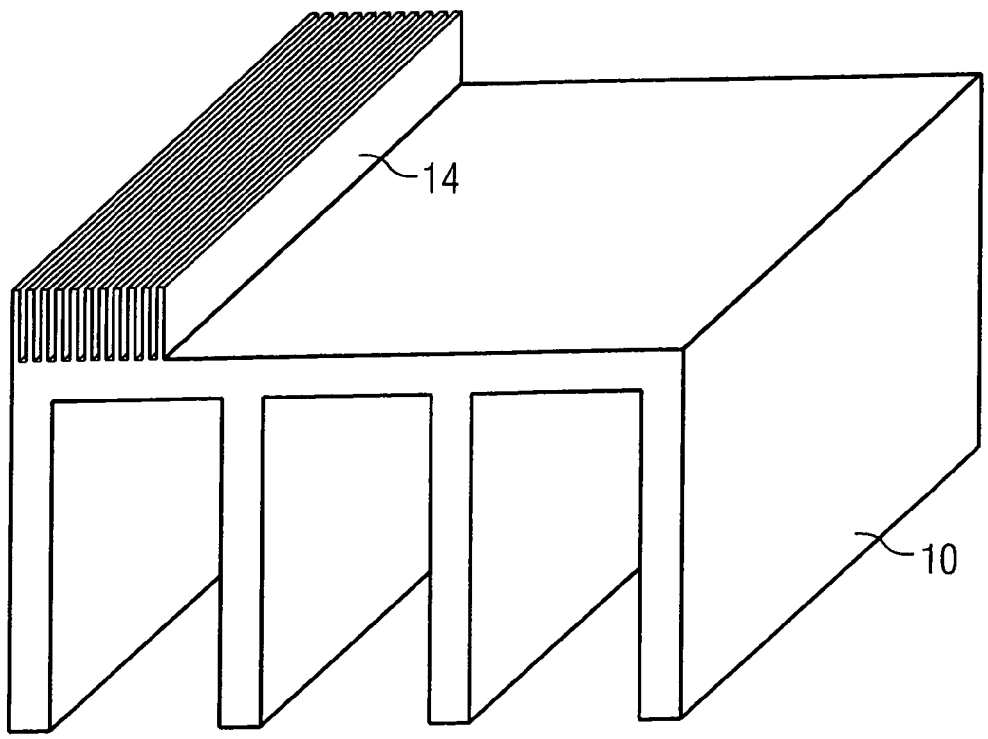
FIGS. 3A–3C show different embodiments of the basic body.

FIG. 3a illustrates an embodiment of a basic body 10 with additionally arranged cooling fins 14. For the sake of simplicity, a few cooling fins 14 are indicated, but the cooling fins may be distributed over the entire surface of the basic body 10. These cooling fins 14 represent an increase in the surface area of the basic body, by which heat stored in the basic body 10 can be dissipated to the surrounding air more rapidly.

Figure 3B:
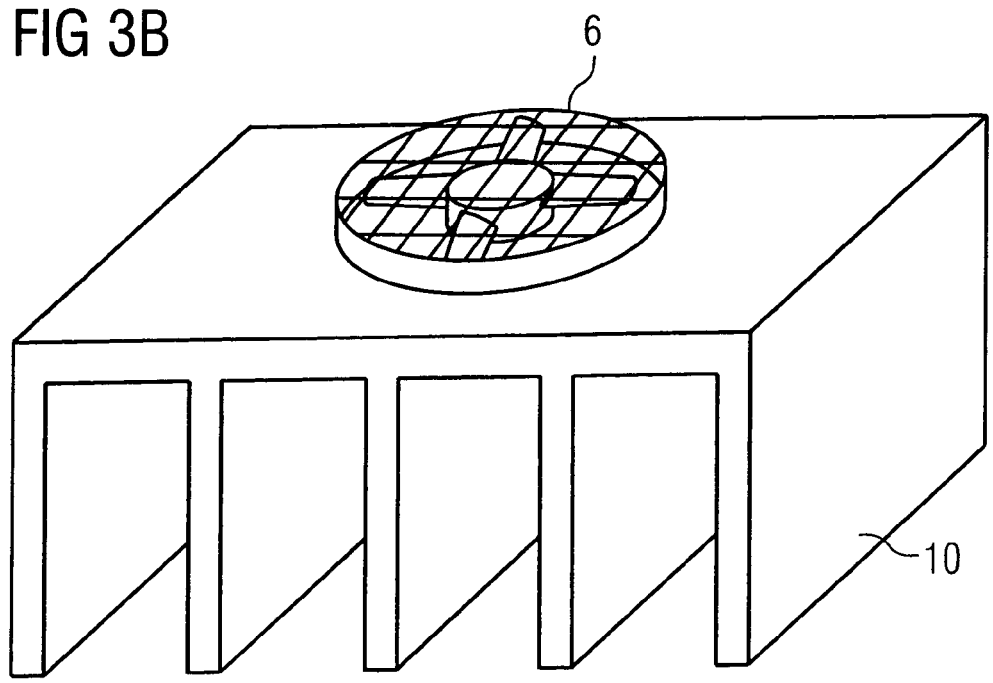

FIG. 3b illustrates another configuration of the basic body 10. By a fan 6, the heated air surrounding the cooling device can be replaced by colder air. In this case, the cooling capacity of the fan can be regulated in a temperature-dependent manner.

Figure 3C:
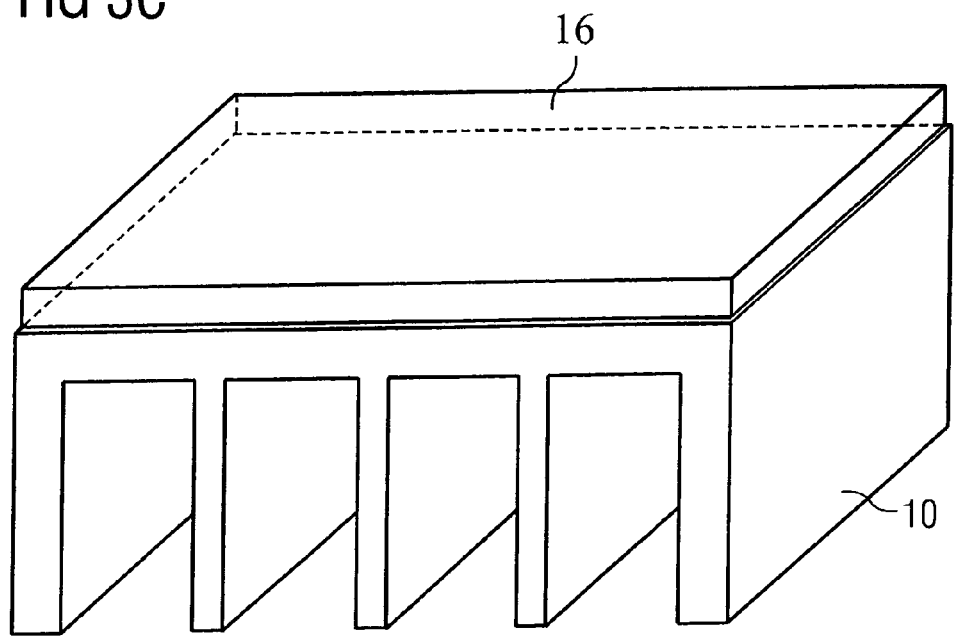

FIG. 3c shows an embodiment of the basic body 10, in which the cooling is represented by a Peltier element 16. A Peltier element acts in a manner comparable to a heat pump and generates a temperature gradient. The latter has the effect that the side facing the cooling device behaves like a heat sink and thus takes up heat from the basic body 10.

The embodiments set forth above and the configuration of the basic body can be combined with one another in order to effectively dissipate the thermal power emitted by the memory modules.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 cooling device
2 main board
3 processor
4 slots for peripheral cards
5 memory modules
6 slots
7 module board
8 memory chips
10 basic body
11 spring element
12 contact areas
13 insulation layer
14 cooling fins
15 Connection
16 Peltier element

We claim:

1. A device for cooling memory modules comprising:
   a body comprising a comb-shaped configuration in longitudinal section and including a plurality of elements, the elements thermally coupling at least two memory modules, wherein at least two adjacently aligned elements include surfaces that face each other, each surface including a contact element extending from and connected to the surface via a spring element that biases the contact element away from the surface, such that the contact elements extend toward and engage with a memory module that is placed between the adjacently aligned elements.

2. The device as claimed in claim 1, wherein the contact elements include planar areas that contact a memory module inserted between the adjacently aligned elements.

3. The device as claimed in claim 1, wherein the body is formed of aluminum.

4. The device as claimed in claim 3, wherein an insulation layer is formed at least partially on a surface of each contact element.

5. The device as claimed in claim 1, wherein the body includes cooling fins.

6. The device as claimed in claim 1, wherein the body includes a fan as an active cooling element.

7. The device as claimed in claim 1, wherein the body includes a Peltier element as an active cooling element.

* * * * *